(12) United States Patent
Yang et al.

(10) Patent No.: US 8,822,256 B1
(45) Date of Patent: Sep. 2, 2014

(54) METHOD FOR FABRICATING INFRARED SENSORS

(71) Applicant: Bae Systems Information and Electronic Systems Integration Inc., Nashua, NH (US)

(72) Inventors: Chi-Hua Yang, Manassas, VA (US); David Sargent, Manassas, VA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 13/856,784

(22) Filed: Apr. 4, 2013

(51) Int. Cl.
*H01L 21/00* (2006.01)
*C23C 4/12* (2006.01)

(52) U.S. Cl.
CPC .................................. *C23C 4/127* (2013.01)
USPC .................................. 438/57; 257/E31.001

(58) Field of Classification Search
None
See application file for complete search history.

(56) References Cited

U.S. PATENT DOCUMENTS

| | | | |
|---|---|---|---|
| 5,233,265 A * | 8/1993 | Takasaki et al. | 313/366 |
| 5,850,098 A * | 12/1998 | Butler et al. | 257/467 |
| 8,050,307 B2 | 11/2011 | Day et al. | |
| 2005/0032374 A1 | 2/2005 | Spandre | |
| 2013/0026409 A1* | 1/2013 | Baker et al. | 252/62.2 |

* cited by examiner

*Primary Examiner* — Seahvosh Nikmanesh
(74) *Attorney, Agent, or Firm* — Yudell Isidore Ng Russell; Antony P. Ng

(57) ABSTRACT

A method for fabricating infrared sensors is disclosed. a chalcogenide layer is initially deposited on a substrate. A group of vias is then formed within the chalcogenide layer. After the vias have been converted to a group of studs, a vanadium oxide layer is deposited on the chalcogenide layer covering the studs. Next, the vanadium oxide layer is separated into multiple vanadium oxide membranes. After the chalcogenide layer has been removed, each of the vanadium oxide membranes is allowed to be freestanding while only supported by a corresponding one of the studs. The vanadium oxide membranes will be used as infrared sensors.

6 Claims, 2 Drawing Sheets

METHOD FOR FABRICATING INFRARED SENSORS

BACKGROUND OF THE INVENTION

1. Technical Field

The present invention relates to optical sensors in general, and in particular to a method for fabricating infrared sensors.

2. Description of Related Art

A bolometer type infrared sensor is an optical sensor that detects infrared radiation by using a material capable of changing resistance values based on temperatures. In conjunction with an absorber for converting electromagnetic radiation to heat, and a detector for measuring an increase in temperature, a bolometer can measure the intensity of electromagnetic radiation of a specific wavelength range (such as 3-15 µm). Depending on a thermal capacity of the material, there is a direct connection between the amount of radiation absorbed and the resulting increase in temperature. Thus, the increase in temperature may serve as a measure of the intensity of an incident radiation.

A bolometer may be used as an infrared sensor, an imager for a night-vision device or as a thermal imaging camera. A bolometer serving as an infrared sensor includes a thin layer that is arranged within the sensor in a thermally insulated manner, e.g., suspended as a membrane. The infrared radiation is absorbed within the membrane whose temperature increases as a result. If the membrane includes a metallic or a semiconducting material, the electrical resistance will change depending on the increase in temperature and on the temperature coefficient of resistance of the material being used. Alternatively, the membrane can be an insulator (such as an oxide) onto which the resistor has been deposited as a further thin layer.

The present disclosure provides a method for fabricating optical sensors such as bolmeters.

SUMMARY OF THE INVENTION

In accordance with a preferred embodiment of the present invention, a chalcogenide layer is initially deposited on a substrate. A group of vias is then formed within the chalcogenide layer. After the vias have been converted to a group of studs, a vanadium oxide layer is deposited on the chalcogenide layer covering the studs. Next, the vanadium oxide layer is separated into multiple vanadium oxide membranes. After the chalcogenide layer has been removed, each of the vanadium oxide membranes is allowed to be freestanding while only supported by a corresponding one of the studs.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
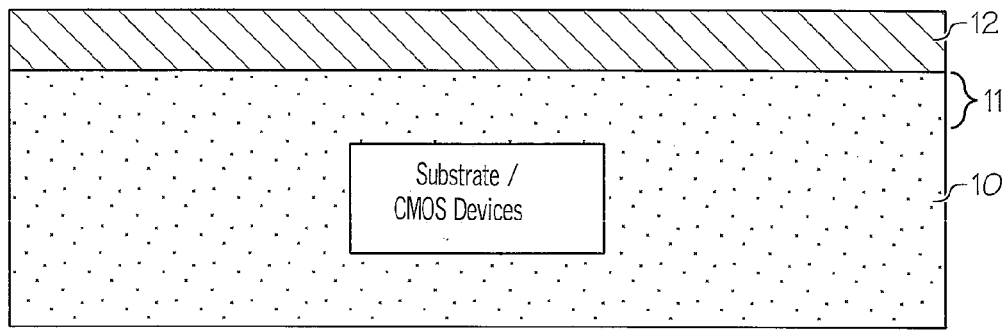
FIGS. 1-5 are diagrams illustrating a method for fabricating optical sensors, in accordance with a preferred embodiment of the present invention.

Referring now to the drawings and in particular to FIGS. 1-5, there are illustrated a method for fabricating optical sensors, in accordance with a preferred embodiment of the present invention.

Initially, a chalcogenide layer 12 is deposited on top of a substrate 10, as shown in FIG. 1. Chalcogenide layer 12 can be made of $Ge_2Sb_2Te_5$. The deposition of chalcogenide layer 12 is preferably performed via a plasma vapor deposition (PVD) at ~120° C. Substrate 11, which can be made of silicon, has already been completed with various electrical devices 11. Electrical devices 11 are preferably fabricated on substrate 10 via a complementary-metal oxides semiconductor (CMOS) process that is well-known to those skilled in the art.

Figure 2:
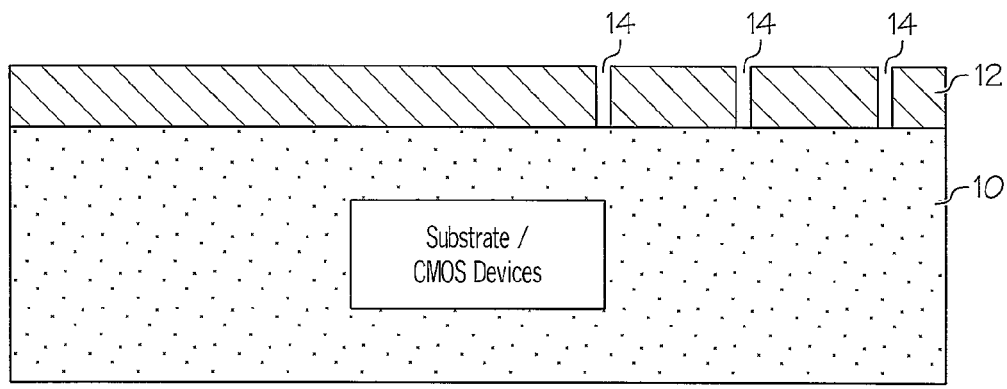

Multiple vias 14 can be then formed within chalcogenide layer 12, as depicted in FIG. 2, by patterning and etching chalcogenide layer 12. The etching can be performed via reactive ion etching (RIE) or a plasma etch in a $HBr/Cl_2/N_2$ based chemistry.

Figure 3:
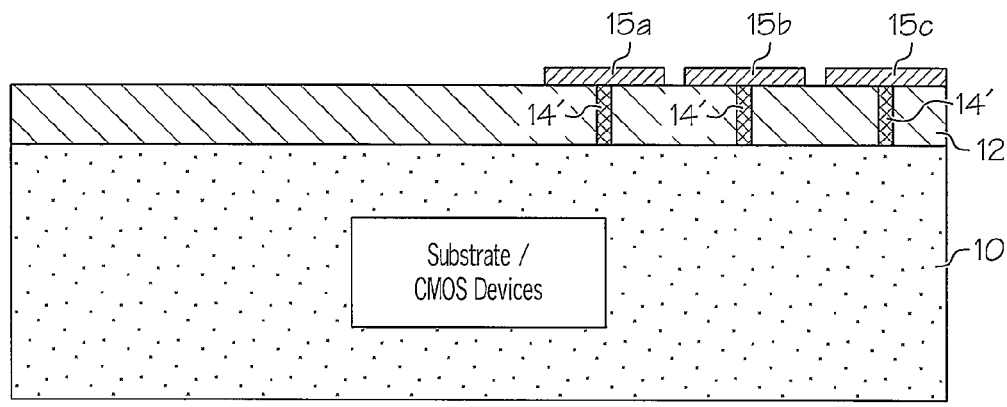

After vias 14 have been filled with tungsten to form studs (or contacts) 14', a vanadium oxide layer is deposited on top of chalcogenide layer 12 to cover studs 14'. The vanadium oxide layer is then patterned and etched to form separate vanadium oxide membranes 15a-15c, as shown in FIG. 3, to be used for temperature sensing.

Figure 4:
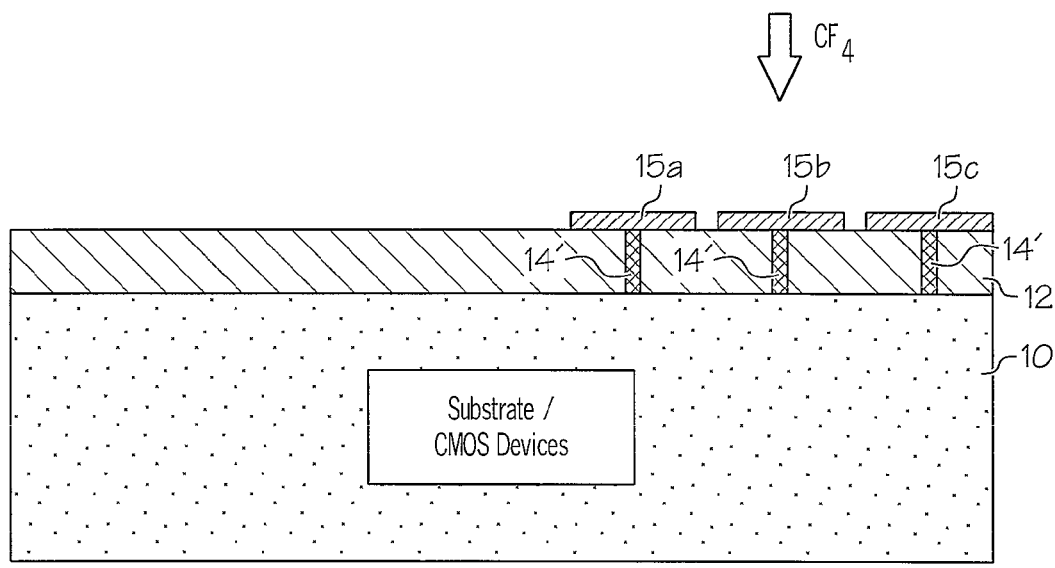
Figure 5:
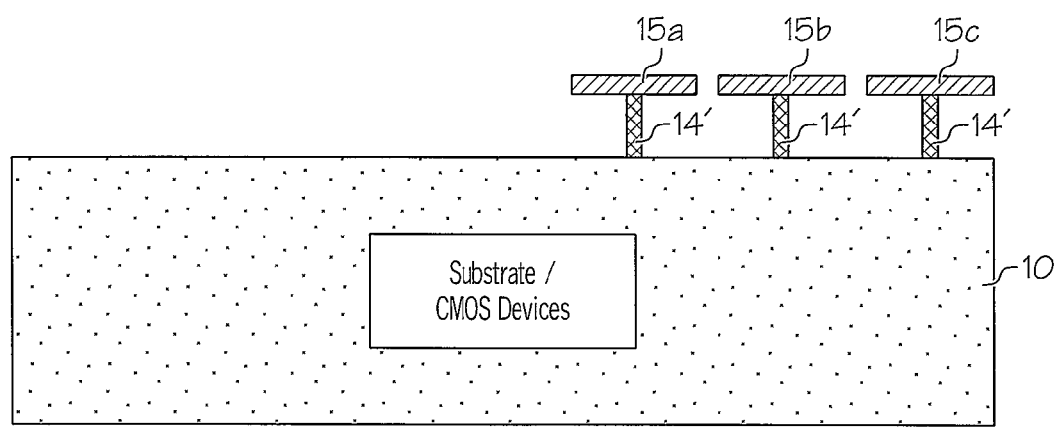

Next, substrate 10 is exposed to $CF_4$ down stream plasma at ~250° C., as shown in FIG. 4. The $F^+$ ions from $CF_4$ will attack only chalcogenide layer 12 but not vanadium oxide membranes 15a-15c and studs 14'. As a result, each of vanadium oxide membranes 15a-15c supported by respective studs 14' remain on top of substrate 10, as depicted in FIG. 5. Vanadium oxide membranes 15a-15c will subsequently be used as thermal image membranes for the fabrication of a thermal imaging device.

As has been described, the present invention provides a method for manufacturing optical sensors.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing an optical sensor, said method comprising:
   depositing a chalcogenide layer on a substrate;
   forming a plurality of vias within said chalcogenide layer;
   converting said plurality of vias to a plurality of studs;
   depositing a vanadium oxide layer on said chalcogenide layer and said plurality of studs;
   separating said vanadium oxide layer into a plurality of vanadium oxide membranes; and
   removing said chalcogenide layer to allow each of said plurality of vanadium oxide membranes to be freestanding while only supported by a corresponding one of said studs.

2. The method of claim 1, wherein said chalcogenide layer is deposited on said substrate via a plasma vapor deposition.

3. The method of claim 1, wherein said plurality of vias are filled with tungsten to form said plurality of studs.

4. The method of claim 1, wherein said chalcogenide layer is removed by exposing said substrate to $CF_4$ down stream plasma.

5. The method of claim 1, wherein said substrate is completed with a plurality of electrical devices.

6. The method of claim 1, wherein said chalcogenide layer is made of $Ge_2Sb_2Te_5$.

* * * * *